United States Patent [19]

Klüpfel et al.

[11] 3,753,715

[45] Aug. 21, 1973

[54] PHOTOPOLYMERIZABLE COPYING MATERIAL

[75] Inventors: Kurt-Walter Klüpfel, Wiesbaden-Sonnenberg; Ursula Elter, Wiesbaden-Biebrich, both of Germany

[73] Assignee: Kalle Aktiengesellschaft, Wiesbaden-Biebrich, Germany

[22] Filed: July 19, 1971

[21] Appl. No.: 163,999

[30] Foreign Application Priority Data

July 23, 1970 Germany.................. P 20 36 585.6

[52] U.S. Cl. ...................... 96/86 P, 96/35.1, 96/67, 96/87 R, 96/115 P

[51] Int. Cl. .............................................. G03c 1/68

[58] Field of Search .................. 96/115 P, 67, 35.1, 96/86 P, 87

[56] References Cited

UNITED STATES PATENTS

| | | | |
|---|---|---|---|
| 3,458,311 | 7/1969 | Alles | 96/115 P |
| 3,203,805 | 8/1965 | Burg | 96/115 P |
| 2,732,304 | 1/1956 | Vanselow et al. | 96/67 |
| 3,240,604 | 3/1966 | Cook | 96/73 |

*Primary Examiner*—Ronald H. Smith
*Attorney*—James E. Bryan

[57] ABSTRACT

This invention relates to a photopolymerizable copying material comprising a support, a photopolymerizable copying layer thereon containing a photoinitiator and a low molecular weight vinyl or vinylidene compound polymerizable by exposure to light, and a top layer only slightly permeable to oxygen and transparent to actinic light, said top layer containing, as an oxygen inhibitor, at least one low molecular weight film-forming compound soluble in water at 20° C.

9 Claims, No Drawings

PHOTOPOLYMERIZABLE COPYING MATERIAL

This invention relates to a new photopolymerizable copying material which comprises a support, a photopolymerizable copying layer containing a low-molecular weight vinyl or vinylidene compound polymerizable by exposure to light and a photoinitiator, and a top layer slightly permeable to oxygen and transparent to actinic light.

It is known to protect the copying layers of photopolymerizable copying materials, by laminated strippable cover sheets of transparent film-forming substances, from dust, mechanical damage and, particularly, from too rapid diffusion of oxygen during image-wise exposure. The cover sheet must be stripped before development of the copying layer, i.e., processing requires an additional step. Furthermore, lamination of the film to a photopolymer layer easily may result in air inclusions which may interfere considerably with image-wise polymerization of the layer.

For overcoming this drawback, thin protective layers have been applied from a melt or solution and for this purpose there have been used waxes, on the one hand and, on the other hand, macromolecular organic polymers soluble in water, such as polyvinyl alcohol and its partial esters, partial ethers, and partial acetals, as well as other natural or synthetic materials of higher molecular weights, such as gelatin, gum arabic, copolymers of methyl vinyl ether and maleic anhydride, polyvinyl pyrrolidones and water-soluble polymers of ethylene oxide with molecular weights in the range from 100,000 to 3,000,000. Wetting agents in relatively small quantitites have been preferably added to the aqueous coating solutions.

Coating of photopolymer layers, generally attacked by organic solvents, with wax layers requires application from a melt, however, which is cumbersome and results in a product which cannot be easily developed with aqueous solutions.

These disadvantages are avoided by the use of the aforementioned water-soluble macromolecular organic polymers for the production of the protective layer. In this case, other drawbacks are involved, however. The solubility of the macromolecuar organic polymers in water often is limited and dissolution of the polymers in water often occurs very slowly. In this case, gel portions often remain undissolved, which may interfere considerably with coating and the complete separation of which by filtration may be very time-consuming.

On the other hand, the solutions of the macromolecular organic polymers require a certain minimum time to dry to become homogeneous coatings. The speed at which such copying materials can be technically coated is limited thereby.

The desirable oxygen excluding power of these layers furthermore is so high that the copying materials produced therewith have a good reciprocity, i.e., a linear dependence of the exposure effects on the irradiated quantity of light, but simultaneously a gradation which is too steep for many purposes.

The purpose of the present invention is to provide an oxygen-inhibiting coating which overcomes the described disadvantages of the prior art.

The invention is based upon a photopolymerizable copying material which comprises a support, a photopolymerizable copying layer containing a low-molecular weight vinyl or vinylidene compound polymerizable by exposure to light and a photoinitiator, and a top layer slightly permeable to oxygen and transparent to actinic light.

The top layer contains as the oxygen-inhibiting constituent at least one low molecular weight inorganic or organic film-forming compound which is practically completely soluble in water at 20° C.

The compounds used as oxygen-inhibiting constituents in accordance with the invention may have only little, or practically no, crystallization tendency upon separation from aqueous solution.

Suitable substances are salts of monomeric and oligomeric phosphoric acids, e.g., primary and secondary sodium phosphate, hexasodium tetrapolyphosphate, and penta-ammonium tripolyphosphate, and mixtures of such salts; organic phosphonic acids and the water-soluble salts thereof, e.g., nitrilomethylene phosphonic acid; monomeric and oligomeric carbohydrates, including the reduction and oxidation products derived therefrom, as well as their esters, ethers, salts, and the like, e.g., arabitol, sorbitol, pentaerythritol, dipentaerythritol, tetramethylol cyclopentanol, tetramethylol cyclohexanol, anhydroenneaheptite, gluconic acid, galactonic acid, galacturonic acid, and mucic acid, as well as their alkali or ammonium salts; glucose, galactose, fructose, mannose, arabinose, saccharose, lactose, maltose, methyl glucose, hydroxyethyl glucose, saccharose monolaurate, saccharose monopalmitate, and saccharose-mono-12-hydroxy-stearate; and wetting agents such as saponins, sodium salts of alkylated sulfosuccinic acids and alkylated aryl sulfonic acids, polyglycols, polyglycol alkyl phenol ether, polyoxyethylene sorbitan fatty acid esters, and the like.

The substances used in accordance with the invention have in common that they completely dissolve in water in the concentrations necessary for coating. Due to their surface activity and molecular size, some of them, e.g., certain wetting agents, such as saponins, form colloidal solutions appearing slightly turbid. This has no disadvantage, however, for the use in accordance with the invention.

Generally, the substances used in accordance with the invention have molecular weights below 1,000. When this value is substantially exceeded, either the water solubility decreases excessively or the viscosity of the aqueous solution increases excessively so that drying of the layer is retarded.

The molecular weight preferably should not be below 150 since otherwise the crystallization tendency of many substances is too high. For preventing crystallization, it has proved advantageous to use mixtures of the above-mentioned substances, e.g., of sugars of different compositions or molecular sizes. It also may be of advantage to add a relatively small quantity of a high molecular weight water-soluble substance as a binder to the layer; the high molecular weight substance itself may or may not have an oxygen-inhibiting action. In this manner, it is possible to produce top layers with specific properties, e.g., with an exactly dosable barrier action with respect to oxygen, and thus to produce materials with specific desirable copying properties, for example.

The carbohydrates, particularly sugar and sugar derivatives, preferably with molecular weights between 150 and 600, have proved particularly suitable oxygen-inhibiting constituents. Mixtures of homologous substances as are obtained, for example, by heating saccharose to 190° C., have proved particularly suitable.

When the substance used in accordance with the invention itself has no wetting properties, it is advantageous to add about 1 to 10 percent by weight of a wetting agent, calculated on the weight of the solid substance, to the coating solution.

Since the top layers of the copying material of the invention are composed at least predominantly of low molecular weight substances, also when they are thicker, they have only a relatively slight mechanical cohesion and thus no tendency to the formation of self-supporting films. This means that, compared to layers of high molecular weight substances, they have a considerably smaller tear or tear propagation tendency upon mechanical damage or stress. When, for example, superposed sensitized plates carrying a top layer of polyvinyl alcohol are displaced with respect to one another, the polyvinyl alcohol film easily may be damaged at some point and tearing may continue therefrom. Upon exposure of the plate later on, image reproduction is adversely affected at this point since the oxygen of the air may freely pass through the damaged area.

The top layers of the copying material of the invention, having the same thickness, have a greater oxygen permeability than do the known high molecular weight top layers. But they guarantee a good reciprocity of the copying layer, even upon relatively long exposure times, and simultaneously effect, in the desired manner, a flatter gradation of the copies. The optical density of the layer is also favorably influenced thereby. These copying properties are of particular advantage for the production of screenless offset prints. In the case of screened copies, true reproduction of screen dots is improved and smearing of coarse screen areas during inking up of the polymerized areas is prevented.

The top layers are applied from aqueous solutions which may contain small quantities of organic solvent. The solutions generally contain about 3 to 10 percent of solids. After drying, the layer should have a thickness from about 0.2 to 6 $\mu$m, preferably from about 0.5 to 3 $\mu$m. Contrary to high molecular weight top layers, exceeding these layers thicknesses is not critical. Top layers according to the present invention dry substantially more easily and rapidly after application, i.e., they may be produced on a technical scale at a higher coating speed.

The photopolymerizable layer of the copying material of the invention contains, as the polymerizable constituent, at least one vinyl or vinylidene compound which is capable of polymerization upon exposure to light. Suitable polymerizable compounds are known and are described in U.S. Pat. Nos. 2,760,863 and 3,060,023, for example. Examples are acrylic and methacrylic esters, such as diglycerol diacrylate, guaiacol glycerol ether diacrylate, neopentylglycol diacrylate, 2,2-dimethylol-butanol-(3)-diacrylate, and acrylates or methacrylates of polyesters containing hydroxyl groups, of the Desmophen (registered trade mark) type. Furthermore, prepolymers of those polymerizable compounds, e.g., prepolymers of allyl esters, which still contain polymerizable groups, are suitable for the production of the photopolymer layers. Generally, those compounds are preferred which contain two or more polymerizable groups.

The photopolymer layer furthermore contains at least one photoinitiator. Suitable initiators are, for example, hydrazones, five-membered nitrogen-containing heterocycles, mercapto compounds, pyrylium or thiopyrylium salts, multi-nuclear ketones, dye/oxidation-reduction systems, and certain acridine and phenazine compounds.

When using as photopolymerizable compounds monomeric or very low molecular weight oligomeric compounds with vinyl or vinylidene groups, it is generally necessary to add a high molecular weight binder to the layer in order to obtain a solid, non-tacky copying layer. The binders preferably should be soluble, or at least swellable, in aqueous alkalies so that the layer may be developed with the preferred weakly alkaline developer solutions. Suitable are, for example, polyamides, polyvinyl acetates, polymethyl methacrylates, polyvinyl butyrals, unsaturated polyesters, copolymers of styrene and maleic anhydride, maleic resins, terpene phenol resins, and the like.

It is possible to further add to the copying layers dyes, pigments, polymerization inhibitors, dye-forming agents, and hydrogen donors. These additives, however, preferably should not absorb excessive quantities of the actinic light necessary for the initiation procedure. Suitable hydrogen donors are, as is known, substances with aliphatic ether bonds, for example. This function also may be fulfilled by the binder or the polymerizable substance so that additional hydrogen donors are not necessary.

Suitable supports, for example, are aluminum, zinc, copper, steel, multi-metal foil, polyester or acetate film, and Perlon (R) gauze, the surfaces of which may have been subjected to pretreatment. If required, an adhesive intermediate coating or an anti-halo layer is applied between the support and the light-sensitive layer.

The copying materials preferably are used in the production of offset printing forms, relief images, multi-metal printing forms, relief printing forms, printed circuits, screen printing stencils, and printing forms for screenless offset printing.

Development of the copying materials of the invention is performed in known manner with aqueous, preferably weakly alkaline, solutions. The developer solutions also may have a relatively small portion of organic solvents miscible with water. The may further contain wetting agents, dyes, salts, and other additives.

The following examples describe preferred embodiments of the copying material of the invention. If not stated otherwise, percentages are by weight; 1 part by weight is 1 g if 1 part by volume is 1 ml.

EXAMPLE 1

A coating solution is prepared from

- 1.4 parts by weight of a copolymer of methyl methacrylate and methacrylic acid with a mean molecular weight of 40,000 and an acid number of 90 to 115,
- 1.4 parts by weight of 1,1,1-trimethylol-ethane-triacrylate, prepared by esterification of trimethylol ethane with acrylic acid,
- 0.2 part by weight of 1,6-di-hydroxyethoxy-hexane,
- 0.1 part by weight of 2-ethyl-anthraquinone,
- 0.01 part by weight of Supranol Blue GL (Colour Index 50,335), and
- 13.0 parts by weight of ethylene glycol monoethyl ether, and applied by whirl-coating to a 0.3 mm thick electrolytically roughened anodized aluminum foil in a thickness of about 5.5 g/m² (dry weight).

In a second process step, the previously dried, solvent-free photopolymer layer is provided with a top layer of a thickness of 1.3 g/m² by coating it with a solution of 5.0 parts by weight of sucrose fused at 190° C.,
2.0 parts by weight of sucrose, and
0.35 part by weight of saponin in
93.0 parts by weight of water.

The plate obtained is exposed for 1 minute under a negative to a 5,000 watt xenon point lamp (COP XP 5000 of Messrs. Staub, Neu Isenburg, Germany, distance frame/lamp 80 cm).

After image-wise exposure under a negative, the non-image areas are removed with an aqueous alkaline developer according to Example 8 of German Patent Specification No. 1,193,366. The plate is then briefly wiped over with an about 1 percent aqueous phosphoric acid solution.

A positive printing form is obtained which accepts ink well, yields very long printing runs, and the non-image areas of which remain free from scumming.

EXAMPLE 2

A solution of 1.3 parts by weight of trimethylol propane triacrylate,
1.4 parts by weight of a copolymer of styrene and maleic anhydride, having a mean molecular weight of 10,000, an acid number of 190, and a softening temperature of about 190° C. (Lytron 822, registered trademark of Monsanto Chemical Co., St. Louis, U.S.A.),
0.2 part by weight of 1,6-di-hydroxyethoxy-hexane,
0.1 part by weight of phenanthrene quinone,
0.02 part by weight of Supranol Blue GL, and
17.0 parts by weight of ethylene glycol monoethyl ether, is applied by whirl-coating to an electrolytically roughened 0.1 mm thick aluminum sheet (Rotablatt of Rotaprint AG, Berlin, Germany). The layer is then dried for 2 minutes at 100° C. in a drying cabinet and a thickness of about 5 g/m² is obtained.

In a second process step, a top layer of a thickness of 1 g/m² is applied from a solution of 3.0 parts by weigh of sorbitol, and
0.15 part by weight of saponin in
97.0 parts by weight of water to the photopolymer layer.

The layer combination is exposed for 2 minutes to the light source of Example 1 under a continuous tone grey wedge, having 21 steps, of Eastman Kodak Co., the density range of which is 0.05 to 3.05 with density increments of 0.15.

The plate is treated with a developer solution of 1 percent trisodium phosphate, the non-exposed areas being removed thereby.

A highly ink-receptive printing form is obtained of which 5 steps of the grey wedge are fully polymerized. With a doubled exposure time (4 minutes), 7 fully inked grey steps are obtained, as expected.

EXAMPLE 3

To a copying material comprising a support and a photopolymer layer as in Example 1, there are applied oxygen-inhibiting top layers of thicknesses from 0.8 to 1.5 g/m² from solutions of the following compositions. The reciprocity in dependence on the exposure time is proved by the linear increase of the number of the steps of the grey wedge, observed after development.

| Coating solution | Number of steps at an exposure time of amino | 4 min. | Developer |
|---|---|---|---|
| 1. 5 parts by weight of hexasodium tetrapolyphosphate (Polyron S of Chem. Fabr. Benckiser GmbH, Ludwigshafen/Rhein, Germany) and 0.25 part by weight of saponin in 95.0 parts by weight of water | 12 | 14 | 1 percent aqueous trisodium phosphate solution |
| 2. 3 parts by weight of gluconic acid and 0.15 part by weight of saponin in 97.0 parts by volume of water | 10 | 12 | |
| 3. 5 parts by weight of saccharose, fused at 190° C., 0.5 part by weight of sodium tripolyphosphate, and 0.25 part by weight of saponin in 94.5 parts by volume of water | 10 | 12 | |

Instead of the 1 percent trisodium phosphate solution, it is also possible to use the developer described in German Patent Specification No. 1,193,366, Example 8.

EXAMPLE 4

The photopolymer layer described in Example 2 is applied by casting in a thickness of about 5 g/m² to a 0.3 mm thick electrolytically roughened anodized aluminum foil.

Subsequently, a coating solution of 3.0 parts by weight of saccharose-mono-12-hydroxystearate, and
97.0 parts by volume of water is prepared by heating to 45° C. Upon cooling to room temperature, the solution becomes slightly turbid. This turbidity does not interfere with the formation of the top layer which, after drying, has a thickness of about 1 g/m².

The layer combination is exposed as in Example 2 under a continuous tone grey wedge having 21 steps and developed with 1 percent aqueous trisodium phosphate solution.

At an exposure of 1 minute to the light source of Example 1, 3 fully inked grey steps are obtained and, in the case of 2 minutes, 5.

EXAMPLE 5

The following coating solution is prepared:

5.5 parts by weight of Dapon M, a diallyl isophthalate prepolymer of F.M.C. Corp., Princetown, U.S.A.,
0.184 part by weight of xanthone,
0.046 part by weight of benzil, and
0.046 part by weight of Michler's ketone in
44.5 parts by weight of 4-methoxy-4-methyl-pentanone-2.

Before casting the solution onto an electrolytically roughened, 0.1 mm thick aluminum sheet (Rotablatt of Rotaprint AG), it is necessary to remove any gelled portions from the Dapon M by filtration. After drying, the layer thickness is about 3 g/m².

In a second process step, a solution of 5.0 parts by weight of sucrose heated to 190° C., and
0.25 part by weight of saponin in
95.0 parts by volume of water is applied to the photopolymer layer. The dry layer has a thickness of about $g/m^2$ and adheres firmly to the photopolymer layer.

The layer combination is then exposed for 2 minutes to a 8,000 watt xenon lamp (Bikop of Klimsch and Co., Frankfurt, Germany) under a continuous tone grey wedge having 21 steps.

The plate is then immersed for 1 minute in 1,1,1-trichlorethane and treated for 45 seconds with a desensitizing solution of

- 80.0 parts by volume of an aqueous solution of gum arabic (14°B.),
- 12.0 parts by volume of 85 percent phosphoric acid,
- 0.2 part by volume of 50 percent hydrofluoric acid,
- 0.5 part by volume of 30 percent hydrogen peroxide, and
- 7.3 parts by volume of water.

After inking up of the oleophilic areas with greasy printing ink, 11 fully inked steps are obtained.

At an exposure time of 4 minutes, 13 fully inked steps are obtained. Without the coating, 2 wedge steps less are reproduced, i.e., such layers are only half as light-sensitive.

EXAMPLE 6

To a support material and a photopolymer layer as in Example 1, there is applied, in a thickness of about 1 $g/m^2$, an oxygen-inhibiting top layer of the following solution

- 2.5 parts by weight of sucrose heated to 190° C.,
- 1.5 parts by weight of polyvinyl alcohol (Elvanol 52–22 of Du Pont de Nemours and Co., U.S.A.),
- 0.2 part by weight of saponin, and
- 96.0 parts by volume of water.

The layer combination is exposed for 2 minutes to the light source of Example 1 under the continuous tone grey wedge described in Example 2. The plate is then developed with 1 percent aqueous trisodium phosphate solution, the non-image areas being removed thereby.

A highly ink-receptive printing form is obtained, of which 11 steps of the grey wedge are fully polymerized. At the doubled exposure time (4 minutes), 13 fully inkable grey steps are obtained.

EXAMPLE 7

To a 0.3 mm thick electrolytically roughened and anodized aluminum foil, there is applied an about 5 $g/m^2$ thick photopolymer layer from a solution of the following composition:

- 1.4 parts by weight of a copolymer of methyl methacrylate and methacrylic acid with a mean molecular weight of 36,000 and an acid number of 95,
- 1.4 parts by weight of pentaerythritol-triacrylate,
- 0.5 part by weight of 9-phenyl-acridine,
- 0.2 part by weight of 1,6-di-hydroxyethoxy-hexane,
- 0.02 part by weight of the phenazine dye Supranol Blue GL, and
- 16.0 parts by weight of methyl ethyl ketone.

The aluminum provided with this photopolymer layer is cut into three pieces. The first piece (A) is provided with no top layer. The second piece (B) is coated with a solution of

- 1.0 part by weight of methyl cellulose (Tylose MH 50 of Kalle AG, Wiesbaden-Biebrich, Germany), and
- 0.25 part by weight of sodium alkyl benzene sulfonate in
- 98.75 parts by volume of water.

The third piece (C) is coated with a solution of

- 2.0 parts by weight of sucrose,
- 1.0 part by weight of methyl cellulose MH 50, and
- 0.15 part by weight of saponin in
- 96.85 parts by volume of water.

The top layers have a thickness of 1 $g/m^2$ in the dry state.

The copying materials A, B, and C are then exposed to the light source described in Example 1 under the grey wedge indicated in Example 2 for the times given below. After development with the developer described in Example 8 of German Patent Specification No. 1,193,366, the numbers of fully polymerized grey steps given below are obtained (in brackets the still visible steps).

Wedge steps

| Exposure time | 1 min. | 2 min. | 4 min. | 8 min. |
|---|---|---|---|---|
| A | 3 (4 - 6) | 3 (6) | 3 (6) | 3 (6) |
| B | 5 (6 - 8) | 5 (8) | 5 (8) | 5 (8) |
| C | 8 (9) | 10 (11) | 12 (13) | 14 (15) |

It can be seen that only copying material C of the invention complies with the law of reciprocity, whereas material B carrying only methyl cellulose as the top layer has no reciprocity.

EXAMPLE 8

An oxygen-inhibiting top layer is applied in a thickness of 0.8 to 1 $g/m^2$ to a support and a photopolymer layer as in Example 1 from a solution of the following composition:

- 1.0 part by weight of sorbitol,
- 1.0 part by weight of sucrose,
- 1.0 part by weight of methyl cellulose MH 1000 of Kalle AG, Wiesbaden-Biebrich, Germany
- 0.3 part by weight of saponin, and
- 196.7 parts by volume of water.

After exposure and development with 1 percent trisodium phosphate solution, the layer combination has a considerable reciprocity in dependence on the exposure time.

It will be obvious to those skilled in the art that many modifications may be made within the scope of the present invention without departing from the spirit thereof, and the invention includes all such modifications.

What is claimed is:

1. A photopolymerizable copying material comprising a support, a photopolymerizable copying layer thereon containing a photoinitiator and a low molecular weight vinyl or vinylidene compound polymerizable by exposure to light, and a top layer only slightly permeable to oxygen and transparent to actinic light, said top layer containing, as an oxygen inhibitor, at least one carbohydrate having a molecular weight below 1,000.

2. A copying material according to claim 1 in which the top layer has a weight of about 0.5 to 5 $g/m^2$.

3. A copying material according to claim 1 in which the carbohydrate is saccharose.

4. A copying material according to claim 1 in which the top layer comprises a mixture of saccharose and methyl cellulose.

5. A copying material according to claim 1 in which the carbohydrate is saccharose which has been briefly heated to 190° C.

6. A copying material according to claim 1 in which the carbohydrate is sucrose.

7. A copying material according to claim 1 in which the carbohydrate is sorbitol.

8. A copying material according to claim 1 in which the top layer contains a wetting agent.

9. A copying material according to claim 8 in which the wetting agent is saponin.

* * * * *